United States Patent
Ch'ng et al.

(10) Patent No.: US 7,558,116 B2
(45) Date of Patent: Jul. 7, 2009

(54) REGULATION OF BOOST-STRAP NODE RAMP RATE USING CAPACITANCE TO COUNTER PARASITIC ELEMENTS IN CHANNEL

(75) Inventors: Sheau-Yang Ch'ng, Penang (MY); Chin-Ghee Ch'ng, Penang (MY); Kian Huat Hoo, Penang (MY)

(73) Assignee: Spansion LLC, Sunnyvale, CA (US)

( * ) Notice: Subject to any disclaimer, the term of this patent is extended or adjusted under 35 U.S.C. 154(b) by 79 days.

(21) Appl. No.: 11/837,976

(22) Filed: Aug. 13, 2007

(65) Prior Publication Data

US 2009/0046511 A1 Feb. 19, 2009

(51) Int. Cl.
G11C 16/04 (2006.01)
(52) U.S. Cl. ............... 365/185.18; 365/185.13; 365/185.23; 365/204; 365/189.09
(58) Field of Classification Search ............ 365/185.18, 365/185.13, 185.23, 204, 189.09
See application file for complete search history.

(56) References Cited

U.S. PATENT DOCUMENTS

| | | | | |
|---|---|---|---|---|
| 5,056,062 A | * | 10/1991 | Kuwabara et al. ...... | 365/185.23 |
| 5,166,554 A | * | 11/1992 | Reddy et al. ................ | 326/108 |
| 5,504,715 A | * | 4/1996 | Lee et al. ................ | 365/230.06 |
| 5,708,387 A | * | 1/1998 | Cleveland et al. ............ | 327/536 |
| 6,058,050 A | * | 5/2000 | Wu et al. ................ | 365/189.09 |
| 6,137,733 A | * | 10/2000 | Watanabe ............... | 365/189.09 |
| 6,347,052 B1 | * | 2/2002 | Akaogi et al. .......... | 365/185.23 |
| 2003/0021152 A1 | * | 1/2003 | Le et al. ................. | 365/185.18 |
| 2003/0202389 A1 | * | 10/2003 | Werner et al. ............... | 365/200 |
| 2004/0062078 A1 | * | 4/2004 | Kasa et al. ............. | 365/185.11 |
| 2005/0047216 A1 | * | 3/2005 | Kojima .................. | 365/185.33 |

* cited by examiner

*Primary Examiner*—Amir Zarabian
*Assistant Examiner*—Jay Radke
(74) *Attorney, Agent, or Firm*—Turocy & Watson, LLP

(57) ABSTRACT

Systems and/or methods that facilitate accessing data in a memory are presented. The memory can be flash memory that includes a plurality of sectors in an array that can be associated with a decoder component that includes a regulator component, which facilitates performing read operations within a desired period of time. Each sector can be associated with a decoder subcomponent and associated regulator subcomponent. Parasitic resistance and capacitance elements can increase the further in distance a sector and associated decoder component are from a booster component, which is utilized to increase the voltage at a boost-strap node within each decoder subcomponent to facilitate performing read operations. To counter the parasitic elements, each regulator subcomponent can include one or more capacitors, where the number of capacitors and total capacitance value can be determined based on the distance the associated decoder subcomponent is from the booster component.

20 Claims, 7 Drawing Sheets

REGULATION OF BOOST-STRAP NODE RAMP RATE USING CAPACITANCE TO COUNTER PARASITIC ELEMENTS IN CHANNEL

BACKGROUND

A wide variety of memory devices can be used to maintain and store data and instructions for various computers and similar systems. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash and NAND flash, for example. NOR flash evolved from electrically erasable read only memory (EEPROM) chip technology, in which, unlike flash, a single byte can be erased; and NAND flash evolved from DRAM technology. Flash memory devices are less expensive and denser as compared to many other memory devices, meaning that flash memory devices can store more data per unit area.

Flash memory devices can include a number of sectors that can include word lines and bit lines associated with memory cells to or from which data can be written and/or read. Each sector can include a plurality of memory cells. Further, each sector can include a boost-strap node to which a voltage can be applied in order to facilitate writing or reading data to/from the flash memory. During a read operation, a voltage source can supply a voltage, so that the respective voltage levels at the boost-strap nodes respectively associated with each of the sectors can be increased to a desired voltage level. The boost-strap node can facilitate enabling the signal at the vertical word line to pass to the memory cell word line to facilitate the reading of data from the memory cell associated with the memory cell word line. The desirable amount of time to raise the boost-strap node voltage to the desired voltage level can be limited. Further, parasitic elements can delay the increase of the voltage level in the boost-strap nodes and/or introduce inconsistencies between the voltage ramp rates of the boost-strap nodes of respective sectors, where such parasitic elements can include resistance in the channel associated with the boost-strap nodes as well as stray capacitance, which can result from the routing of the circuitry in the device.

As flash memory devices have continued to evolve, the density of data stored in such devices has increased. To accommodate the increased data, routing channels in flash memory devices can be made more narrow, which can result in an increase in parasitic resistance in the channel, especially over longer distances in the channel, and flash memory devices also have been subject to more compact routing, which can result in an increase in stray capacitance. As a result, there can be undesirable inconsistency in the boost-strap node ramp rate.

Typically, in a flash memory device, there can be a voltage source and a number of boost-strap nodes, where each boost-strap node can be associated with a sector. Each succeeding sector, and thus, each succeeding boost-strap node, can be situated further away from a preceding sector and associated boost-strap node as well as further away from the voltage source (e.g., booster source) that can be associated with the boost-strap node. During a read operation, the time allowed for boost-strap node to settle at a desired voltage can be very limited. As a result, boost-strap node(s) that are situated far away from the source may not be able to settle and reach the target voltage level, due at least in part to the parasitic resistance and capacitance in the routing channel. This can affect the vertical word line and can prevent the vertical word line from passing to the memory cell word line. It is desirable to maintain a consistent boost-strap node ramp rate and ensure that vertical word lines are passed to the memory cell word lines. Further, it is desirable to increase the speed of read operations.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems and/or methods that facilitate accessing data in memory, such as non-volatile memory (e.g., flash memory). The memory can include a decoder component that can facilitate decoding the memory address from data associated with a command (e.g., read, write, erase) to select the desired memory cell word line associated with the memory cell where the data can be read from, written to, or erased. The decoder component can be comprised of a plurality of decoder subcomponents that can each be correspondingly associated with a plurality of sectors in a memory array in the memory, where each sector can include a plurality of memory cells. Each decoder subcomponent can include therein a boost-strap node, and, during an operation (e.g., read operation), the voltage level at that node is desired to reach a certain level within a predefined period of time in order to pass the voltage level at the vertical word line to the memory cell word line that can be connected to the associated sector and associated memory cell(s) therein.

To facilitate raising the voltage level at that node to the desired level within the predefined period of time, a regulator component can be employed. The regulator component can be comprised of a plurality of regulator subcomponents that can be respectively associated with the decoder subcomponents. Each regulator subcomponent can include one or more capacitors that can be pre-charged during a pre-charge stage, and then a booster component can provide a voltage to the node, and the combination of the voltage stored in the capacitor(s) and the booster voltage can raise the voltage level at the boost strap node to open the gate associated therewith to pass the vertical word line to the memory cell word line.

Parasitic resistance and capacitance elements in the routing channel can be problematic and can cause both the booster voltage to drop the further away in distance via the routing channel the decoder subcomponent is from the booster component as well as signal delay, which can cause the voltage level at the boos-strap node to not reach the desired level within the desired period of time, during a read operation. To counter such parasitic resistance and capacitance elements in the routing channel, the regulator subcomponents can respectively employ distinct amounts of capacitance, where the total capacitance value of the capacitor(s) in a regulator subcomponent can be determined based on the distance, via the routing channel, the decoder subcomponent associated with the particular regulator subcomponent is from the booster component.

In accordance with one embodiment of the disclosed subject matter, the regulator subcomponents can be grouped in a number of groups based on the distance via the routing channel between the decoder subcomponents respectively associated therewith and the booster component. For example, if the memory has thirty-two sectors, there can be thirty-two decoder subcomponents respectively associated therewith and thirty-two associated regulator subcomponents. The decoder subcomponents can be grouped in groups of eight, where the first group of eight decoder subcomponents can be those that are nearest to the booster component, and each other group of eight can be increasingly further away from the booster component. Each of the regulator subcomponents respectively associated with the decoder subcomponents in the group nearest to the booster component can have a base capacitor having a capacitance value that can be optimized so that the voltage level at the boost-strap node can reach the desired level within the desired amount of time, during a read operation. Each of the decoder subcomponents in the second group, which can be the group that is the adjacent to the nearest group, can have associated regulator subcomponents that include the base capacitor, plus an extra-set capacitor, so that the additional capacitance can be used to store additional charge during the pre-charge stage to facilitate ramping up the boost-strap node voltage during the read operation, as desired. The third group of decoder subcomponents, that can be adjacent to the second group, and can be further away from the booster component that the decoder subcomponents of the second group, can each have an associated regulator subcomponent having the base capacitor, plus two extra-set capacitors. Further, the fourth group of decoder subcomponents, that can be adjacent to the third group, and can be the furthest away from the booster component, can each have an associated regulator subcomponent having the base capacitor, plus three extra-set capacitors.

In accordance with another aspect of the disclosed subject matter, during a write operation, in each regulator subcomponent, a pass gate can be employed in each branch that includes an extra-set capacitor, so the pass gate can be switched to cut-off or disconnect the extra-set capacitor(s) from the boost-strap node, so that such extra-set capacitor(s) can not be charged during the pre-charge stage and/or can not provide any charge stored therein to the boost-strap node when the voltage level at the boost-strap node is increased in order to facilitate performing the write operation. After the write operation has been performed, the pass gate(s) can be switched again to re-connect the extra-set capacitor(s) in the circuit so that they can be connected in the circuit to the boost-strap node. By bypassing the extra-set capacitor(s) during a write operation, the potential for ramping up the boost-strap node voltage to too high of a level can be avoided, thereby avoiding potential damage to components and/or incorrect writes to the memory.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
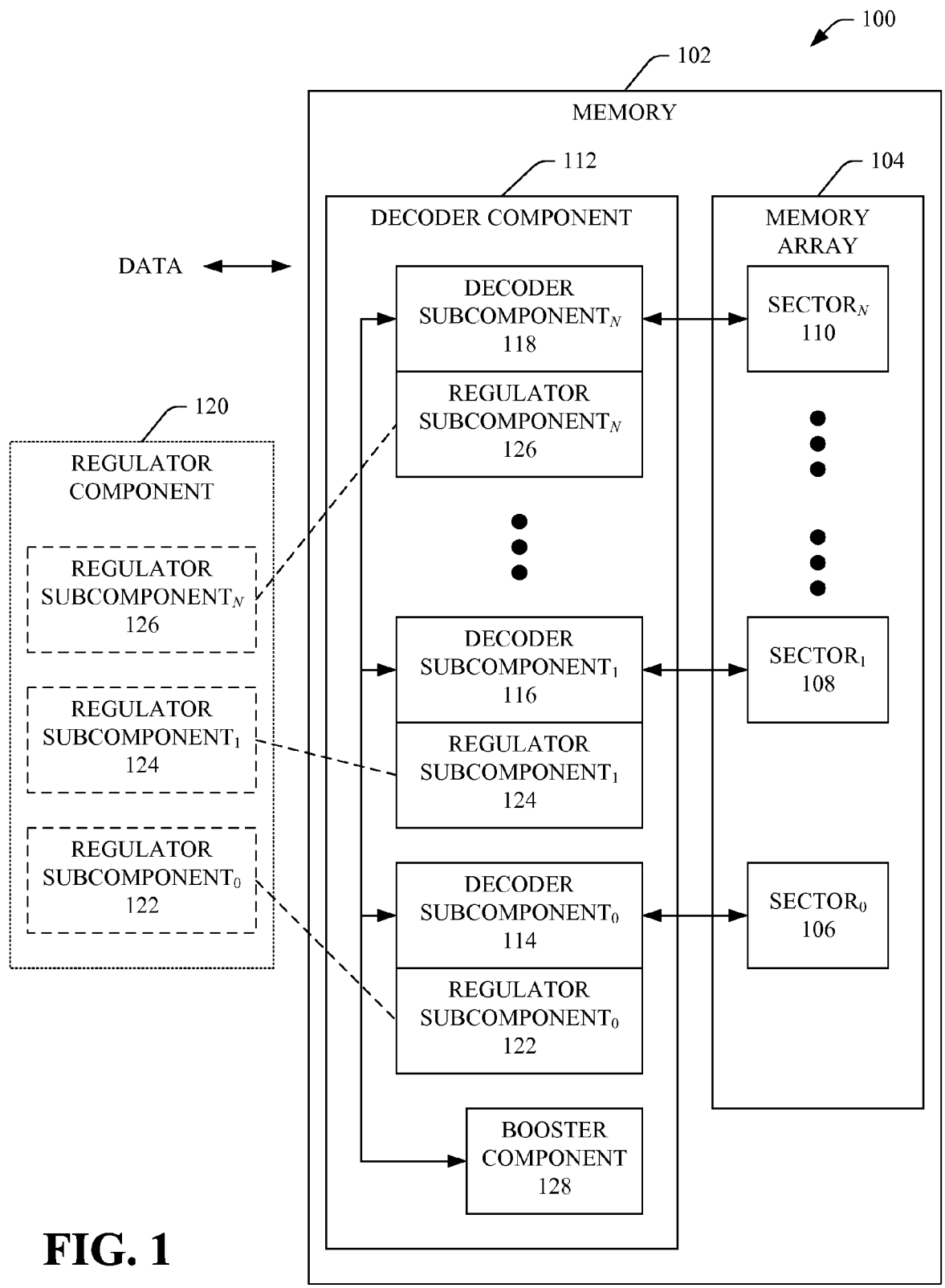
FIG. 1 illustrates a system that facilitates access of data to or from a memory in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Memory devices, such as flash memory devices, are progressively increasing in density, and as a result, the number of sectors in a vertical word block of a flash memory device is increasing to facilitate achieving the desired density. Further, routing channels in memory devices are becoming more narrow and routing more compact to facilitate achieving higher density in memory devices. As a result, parasitic elements (e.g., undesirable resistance and capacitance) can become more problematic, and can increase the longer the distance a voltage source is from the destination (e.g., boost-strap node) to be supplied with the voltage.

Systems and/or methods are presented that facilitate countering the parasitic elements in a routing channel associated with a decoder (e.g., X-decoder) to facilitate performing read operations at a desirable speed to read data from memory. A decoder component associated with a memory device can include a plurality of decoder subcomponents with each having a boost-strap node therein. The decoder component can also include a regulator component that can be comprised of regulator subcomponents that can be respectively associated with the decoder subcomponents.

Each regulator subcomponent can respectively employ distinct amounts of capacitance that can be associated with one or more capacitors, where the total capacitance value of the capacitor(s) in a regulator subcomponent can be determined based on the distance, via the routing channel, the decoder subcomponent associated with the particular regulator subcomponent is from the booster component. The capacitance value employed by a regulator subcomponent can be such that, during a read operation, the capacitance value is sufficient to store and then provide enough charge, along with the voltage provided by the booster component, to facilitate raising the voltage level at an associated boost-strap node to a desired level within a desired amount of time in order to open a gate associated with the boost-strap node to pass the voltage level of the vertical word line to the memory cell word line that can be connected to a memory cell in the memory that is to be accessed to read data therefrom. The charge stored in the capacitor(s) associated with the regulator subcomponent can compensate for the voltage drop and/or signal delay of the booster voltage supplied by the booster component as a result of the parasitic elements in the routing channel.

Now turning to the figures, FIG. 1 depicts a system that facilitates accessing data to/from memory in accordance with the disclosed subject matter. System 100 can include a memory 102 that can include non-volatile memory, such as flash memory, quad-bit flash memory, read only memory (ROM), programmable ROM (PROM), erasable programmable read only memory (EPROM), electronically erasable programmable read only memory (EEPROM), and the like.

The memory 102 can receive data into memory 102 and transmit data from the memory 102. For example, the memory 102 can receive data associated with a write operation, including data related to the memory address in memory 102 where the data can be written and stored, as well as the information (e.g., data) being written to the memory address. The memory 102 can also receive data associated with a read operation, including data associated with the memory address from which the desired information can be read, and such information can be read from the memory address specified in the read operation and provided or transmitted from the memory 102. The memory 102 can also receive data associated with other commands, such as erase commands, and can process such erase commands to erase information stored in a memory address associated with the erase command.

With regard to a flash memory, the memory 102 can include a memory array 104 that can include a plurality of sectors, depicted in FIG. 1 as $sector_0$ 106, $sector_1$ 108, and up to $sector_N$ 110, where N can be an integer. Each sector can include a plurality of memory cells (not shown) to which data can be written and from which data can be read. Each memory cell can be associated with a memory address, which can be selected when performing an operation with regard to the associated memory cell. To facilitate the writing and reading of data to/from memory 102, each memory cell can be associated with a particular word line and a particular bit line (e.g., the bit line can be associated with a Y-decoder (not shown)), and when such word line and bit line are selected, such as when a command specifies a memory address that can be associated with such word line and bit line, the reading of data from the memory cell or the writing of data to the memory cell can be facilitated.

The memory array 104 can be associated with a decoder component 112 that can facilitate decoding the address values associated with command data received by the memory 102 in order to activate the desired gates within memory 102 and associated with a particular memory cell in order to perform a read, write, or erase on the memory cell based on the command. With regard to a flash memory, the decoder component 112 can be an X-decoder that can decode the address values to facilitate selection of the word lines of the memory cells to be accessed during an operation, for example. It is to be appreciated that the command data can also provide information as to the desired bit line(s) associated with the memory cell(s) to another component (e.g., Y-decoder) (not shown) to facilitate choosing the appropriate memory cell(s) on which to perform the operation.

The decoder component 112 can include a plurality of decoder subcomponents, depicted in FIG. 1 as $decoder\ subcomponent_0$ 114, $decoder\ subcomponent_1$ 116, and up to $decoder\ subcomponent_N$ 118, where N can be an integer number. Each decoder subcomponent (e.g., 114, 116, 118) can be correspondingly associated with each sector (e.g., 106, 108, 110), and can include electronic circuitry that can facilitate decoding the desired memory address from command data received and facilitate activating or enabling the desired word line(s) to access an associated memory cell and perform the desired operation on the memory cell.

In accordance with an aspect of the disclosed subject matter, the decoder component 112 can also include a regulator component 120 that can include a plurality of regulator subcomponents, depicted in FIG. 1 as $regulator\ subcomponent_0$ 122, $regulator\ subcomponent_1$ 124, and up to $regulator\ subcomponent_N$ 126, where N can be an integer number. Each of the regulator subcomponents (e.g., 122, 124, 126) can be associated with a corresponding decoder subcomponent (e.g., 114, 116, 118), and, during a read operation, can facilitate increasing or ramping up the voltage level at the boost-strap node of the respective decoder subcomponent within a desired period of time to facilitate opening the gate (not shown) within the particular decoder subcomponent to allow the signal at the vertical word line to pass to the corresponding memory cell word line to facilitate accessing the desired memory cell that can be associated with the memory cell word line in order to perform the read operation.

Decoder component 112 can further include a booster component 128 that can be a voltage source to provide an additional amount of voltage to the boost-strap node during a read operation. The booster component 128 can be associated with each decoder subcomponent and, during an operation (e.g., read, write, erase), can provide a level of voltage to each decoder subcomponent to facilitate ramping up the voltage level at the boost-strap node therein within the desired period of time to facilitate performing the operation, where the desired voltage at the boost-strap node can facilitate opening or activating the gate associated with the vertical word line associated with a particular decoder subcomponent to facilitate passing the signal at the vertical word line to the memory cell word line that can be associated with a memory cell in a sector that can be associated with the particular decoder subcomponent.

As sectors and associated decoder subcomponents are positioned farther away from the booster component 128 via the routing channel, and/or as the routing channel that can electrically connect the booster component 128 and the sectors and associated decoder subcomponents becomes more narrow, parasitic elements, such as resistance and/or capacitance based on channel length and/or width, can prevent the boost-strap node from reaching the desired voltage level within the desired period of time during read operations. Regulator component 120 can facilitate enabling boost-strap nodes of respective decoder subcomponents, whether close to the booster component 128 or further away from the booster component 128, to reach the desired voltage level within a desired period of time to facilitate passing the signal at the vertical word line associated with a respective decoder subcomponent to the memory cell word line in order to perform a read (or write) operation on a specified memory cell in a sector associated with the respective decoder subcomponent.

In accordance with an aspect of the disclosed subject matter, a regulator subcomponent (e.g., $regulator\ subcomponent_N$ 126) that is further away from the booster component 128 than $regulator\ subcomponent_0$ 122 can employ additional capacitance, as compared to the capacitance associated with $regulator\ subcomponent_0$ 122, based on the distance between the booster component 128 and the particular decoder subcomponent and associated regulator subcomponent in order to facilitate countering the parasitic elements and enabling the voltage level at the boost-strap node to reach the desired level within the desired amount of time.

For example, decoder subcomponent$_1$ 114 can be the decoder subcomponent closest to booster component 128, and decoder subcomponent$_N$ 118 can be the decoder subcomponent furthest away from the booster component 128. The regulator subcomponent$_0$ 122 can have one capacitance level, which can be at or above the lowest capacitance, or approximately the lowest capacitance, desired in order to facilitate raising the voltage level at the boost-strap node of the associated decoder subcomponent$_0$ 114 to the desired voltage level within the desired period of time. Since decoder subcomponent$_N$ 118 can be further away from the booster component 128 than decoder subcomponent$_0$ 114, during a read operation, parasitic elements can be increased and can cause the booster voltage from the booster component 128 to be at a lower level at the point it reaches the decoder subcomponent$_N$ 118, and as a result, can cause the ramp rate for the voltage level of the boost-strap node to be inconsistent and/or can cause the voltage level to not reach the desired voltage level within the desired period of time to facilitate the read operation. To counter the parasitic elements, the regulator subcomponent$_N$ 126 can have a different capacitance level, which can be higher than the capacitance level of regulator subcomponent$_0$ 122, in order to facilitate raising the voltage level at the boost-strap node of the associated decoder subcomponent$_0$ 114 within the desired period of time The additional amount of capacitance in a particular regulator subcomponent can facilitate storing additional charge, which can be stored in capacitors associated with the particular regulator subcomponent during a pre-charge stage that can occur prior to the boosting stage where the booster component 128 can provide a predefined voltage to raise the boost-strap node voltage to facilitate performing the read operation. The charge stored in such capacitors can be utilized, along with the voltage level from the booster component 128 to provide sufficient voltage at the boost-strap node of a particular decoder subcomponent to ramp up the voltage level at the boost-strap node within the desired amount of time. When the voltage level at the boost-strap node reaches the desired level, the gate associated with the boost-strap node can be opened or enabled to pass the signal at the vertical word line to the memory cell word line that can be associated with a memory cell in a particular sector correspondingly associated with the particular decoder subcomponent in order to facilitate performing the read operation to read data from the memory cell associated with the memory address specified in the read operation.

Further, the voltage level of the booster component 128 can be at a level such that the level is not so high that oxide breakdown occurs on sectors that are closer in distance to the booster component 128. While raising the voltage level of the booster component 128 can enable the decoder subcomponents further away from the booster component 128 to reach the desired voltage level during a read operation, such higher voltage level can cause oxide breakdown on sectors that are closer in distance to the booster component 128.

In accordance with one embodiment of the disclosed subject matter, each regulator subcomponent can have a different capacitance level associated with its boost-strap node that can be based on the distance that a decoder subcomponent associated therewith is from the booster component 128, where a respective capacitance level of a regulator subcomponent can be higher the further away an associated decoder subcomponent (e.g., 118) is from the booster component 128, as compared to the capacitance level employed at the regulator subcomponent$_0$ 122, which can be associated with the decoder subcomponent$_0$ 114, which can be closest to the booster component 128. The capacitance level employed in a particular regulator subcomponent can be determined based on the distance via the routing channel the decoder subcomponent and/or sector associated therewith is from the booster component 128. The capacitance level can be high enough such that the capacitor(s) can store sufficient charge and can provide such charge at the boost-strap node so that, along with the voltage provided by the booster component 128, the voltage level at the boost-strap node is able to reach the desired level within the desired period of time. The capacitance level of the regulator subcomponent can also be low enough so that the voltage level at the boost-strap node does not reach too high of a level, when the voltage is provided by the booster component 128, so as to minimize or eliminate oxide breakdown on a sector(s) or other damage to electronic components.

In accordance with another embodiment of the disclosed subject matter, to facilitate implementation, the sectors, from sector$_0$ 106 to sector$_N$ 110, associated with the decoder component 112 can be grouped into a number of groups. The regulator subcomponents can each have a base capacitor, where the base set can have a desired capacitance level so that when employed in regulator subcomponent(s) (e.g., regulator subcomponent$_0$ 122) associated with the decoder subcomponents (e.g., decoder subcomponent$_0$ 114) and associated sectors (e.g., sector$_0$ 106) nearest in distance via the routing channel to the booster component 128, the voltage level at the boost-strap node of each associated decoder subcomponent can ramp up to the desired voltage level within the desired period of time when the booster component 128 provides a predefined voltage level in order to facilitate the read operation, while at the same time not causing the voltage level at the boost-strap node to become too high, which may cause oxide breakdown on sectors or other harm to electronic components within memory 102.

Decoder subcomponents associated with a group of sectors that are a further distance away from the booster component 128 via the routing channel than the group of sectors closest to the booster component 128 can encounter a higher level of parasitic elements that can impact or prevent the boost-strap nodes of the decoder subcomponents from reaching the desired level within a desired period of time, which can impact or slow down the performance of a read operation. Regulator subcomponents (e.g., regulator subcomponent$_N$ 126) associated with sectors (e.g., sector$_N$ 110) and decoder subcomponents (e.g., decoder subcomponent$_N$ 118) that are further away from the booster component 128 can have one or more extra-set capacitors, in addition to the base capacitor, to facilitate countering the effects of the parasitic elements.

For example, by determining the maximum offset, which can be the boost-strap node level differences between the nearest corner (e.g., at decoder subcomponent$_0$ 114) and the furthest corner (e.g., at decoder subcomponent$_N$ 118), and accounting for the number of sector groups, an appropriate capacitance value for an extra-set capacitor can be determined and utilized in the regulator subcomponents that can have an extra-set capacitor(s) to facilitate desired read operation performance. Further, as the distances between sectors can be relatively consistent, the capacitance value of each extra-set capacitor can be the same, where each group of sectors has the same number of sectors, for example. However, it is to be appreciated that the capacitance values of the extra-set capacitors can be different, as desired, so long as the overall capacitance level of the regulator subcomponent facilitates ramping up the boost-strap node voltage level within the desired period of time in order to perform a read operation.

To illustrate a grouping of sectors in an example, if there are thirty-two (32) sectors associated with the decoder component 112, the sectors can be grouped based on the proximity of their associated decoder subcomponents to the booster component 128 via the routing channel. The sectors can be placed in groups of eight (8), for example, where $sector_0$ 106 through $sector_7$ (not shown) can be grouped together; $sector_8$ (not shown) through $sector_{15}$ (not shown) can be grouped together; $sector_{16}$ (not shown) through $sector_{23}$ (not shown) can be grouped together; and $sector_{24}$ (not shown) through $sector_{31}$ (e.g., $sector_N$ 110) can be grouped together. The regulator subcomponents respectively associated with sectors in a group of sectors can each employ the same capacitance level. To illustrate, if $sector_0$ 106 through $sector_7$ (not shown) are grouped together, each regulator subcomponent (e.g., regulator $subcomponent_0$ 122 through regulator $subcomponent_7$ (not shown)) correspondingly associated therewith can each have the same capacitance level associated with the boost-strap node of the corresponding decoder subcomponent (e.g., decoder $subcomponent_0$ 114 through decoder $subcomponent_7$ (not shown)). In accordance with an aspect of the disclosed subject matter, with regard to the group of sectors, $sector_0$ 106 through $sector_7$, for example, the desired capacitance level can be realized by employing a base capacitor having a total capacitance value that is equivalent, or substantially equivalent, to the desired capacitance level that, when employed in a regulator subcomponent in such group, can facilitate ramping up the boost-strap node voltage level associated with the regulator subcomponent to the desired level within the desired period of time.

The second group of sectors, $sector_8$ through $sector_{15}$, can be correspondingly associated with decoder subcomponents through $subcomponent_{15}$ and regulator subcomponents through regulator $subcomponent_{15}$. Each of these regulator subcomponents can have the base capacitor, plus one extra-set capacitor. The third group of sectors, $sector_{16}$ through $sector_{23}$, can be correspondingly associated with decoder $subcomponent_{16}$ through $subcomponent_{23}$ and regulator $subcomponent_{16}$ through regulator $subcomponent_{23}$. Each of these regulator subcomponents can have the base capacitor, plus two extra-set capacitors. The fourth group of sectors, $sector_{24}$ through $sector_{31}$, can be correspondingly associated with decoder $subcomponent_{24}$ through $subcomponent_{31}$ and regulator $subcomponent_{24}$ through regulator $subcomponent_{31}$. Each of these regulator subcomponents can have the base capacitor, plus three extra-set capacitors.

It is to be appreciated that while the sectors are grouped in groups of eight in the above example, the subject innovation is not so limited, and the sectors can be grouped in any number, as desired, in order to facilitate performance of operations, such as read operations.

In accordance with yet another embodiment of the disclosed subject matter, to facilitate a more uniform circuit layout, each of the regulator subcomponents, regulator $subcomponent_0$ 122 through regulator $subcomponent_N$ 126, can have the base capacitor and the same number of extra-set capacitors. However, depending on the desired capacitance level for a particular regulator subcomponent, certain extra-set capacitors can be dummy capacitors that can remain unused. For example, regulator $subcomponent_0$ 122 can have the base capacitor and a number of extra-set capacitors (e.g., three extra-set capacitors from the example above involving 32 sectors). However, based on the distance from the booster component 128 to the decoding $subcomponent_0$ 114 and/or the amount of parasitic resistance/capacitance encountered at decoding $subcomponent_0$ 114, it may be determined that only the base capacitor is desired in order to facilitate ramping up the voltage at the boost-strap node 202 during read operations. Consequently, it can be determined that, in regulator $subcomponent_0$ 122 (or other regulator subcomponents associated with sectors in the same group as $sector_0$ 106), the base capacitor can be active, but the extra-set capacitors can be dummy capacitors that are not used.

In accordance with still another embodiment of the disclosed subject matter, each regulator subcomponent (e.g., regulator $subcomponent_N$ 126) of the regulator subcomponent 120 that has one or more extra-set capacitors can include one or more pass gates that can be utilized during a write operation to cut-off (e.g., disconnect) or shield each extra-set capacitor to minimize or eliminate the charge such extra-set capacitor can supply to the boost-strap node during a write operation, so as to minimize or eliminate the risk of the voltage level at the boost-strap node overshooting the desired voltage level, for example, to a point where the write operation can be affected and/or electronic components damaged. During a write operation, there can be more time available to wait for the voltage from the booster component 128 to ramp up the voltage level at the boost-strap node, so charge from the extra-set capacitors associated with a regulator subcomponent is not demanded at the boost-strap node.

During the write operation, a voltage source can be employed and can be applied to the pass gate(s) associated with each extra-set capacitor, but not the base capacitor, to shield the boost-strap node from the extra-set capacitors, so the extra-set capacitors can provide no charge, or minimal charge, at the boost-strap node. The base capacitor can still function and provide charge stored therein at the boost-strap node. After the write operation is completed, the voltage source that facilitated switching on the pass gate can be removed or turned off, and the pass gate can thereby be switched off so that each of the extra-set capacitors are no longer shielded from the boost-strap node.

Figure 2:
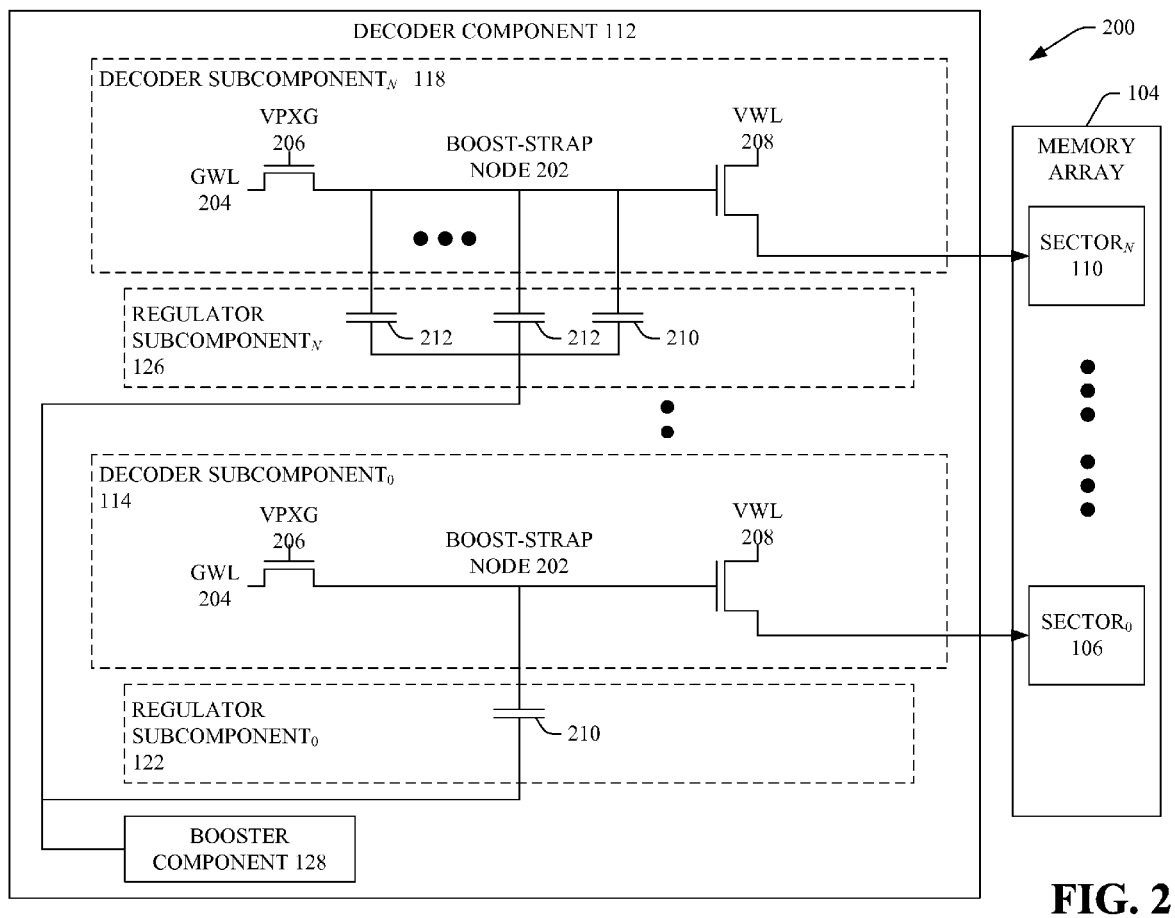
FIG. 2 illustrates another system that facilitates access of data to or from a memory in accordance with an aspect of the subject matter disclosed herein.

Turning to FIG. 2, a system 200 that facilitates accessing data to or from memory in accordance with the disclosed subject matter is illustrated. The decoder component 112 can facilitate writing data to or reading data from a memory device (e.g., memory 102) (not shown), such as a flash memory device, for example. With regard to a flash memory device, the decoder component 112 can be an X-decoder that can facilitate selecting the memory cell to/from which data can be written or read. The flash memory can include a memory array 104 comprising a plurality of sectors, $sector_0$ 106 through $sector_N$ 110, where N can be an integer, and where each sector can include a plurality of memory cells in which data can be stored. The decoder 106, memory array 104, and sectors (e.g., $sector_0$ 106 through $sector_N$ 110) can each function as more fully described herein, for example, with regard to system 100.

Decoder 112 can include a plurality of decoder subcomponents, decoder $subcomponent_0$ 114 through decoder $subcomponent_N$ 118, that can be correspondingly associated with the sectors, $sector_0$ 106 through $sector_N$ 110. Further, to facilitate performance of operations (e.g., read), decoder component 112 can also include a plurality of regulator subcomponents, regulator $subcomponent_0$ 122 through regulator $subcomponent_N$ 126, that can be correspondingly associated with the decoder subcomponents, decoder $subcomponent_0$ 114 through decoder $subcomponent_N$ 118, and/or the sectors, $sector_0$ 106 through $sector_N$ 110. System 200 can further include a booster component 128 that can be a voltage source that can provide a booster voltage at each boost-strap node 202 of respective decoder subcomponents during operations being performed on the memory device (e.g., 102) associated with decoder component 112. The decoder subcomponents (e.g., decoder subcomponent$_0$ 114 through decoder subcomponent$_N$ 118), regulator subcomponents (e.g., regulator subcomponent$_0$ 122 through regulator subcomponent$_N$ 126), and booster component 128 can each function as more fully described herein, for example, with regard to system 100.

A decoder subcomponent (e.g., 118) can facilitate performing an operation, such as a read, write, or erase operation, on a memory cell (not shown) that can be included in a sector (e.g., 106) included in a memory array 104 of a memory device (e.g., 102). A memory cell can be associated with a memory address, and when an operation is being performed, decoder component 112, and decoder subcomponents (e.g. decoder subcomponent$_0$ 114 through decoder subcomponent$_N$ 118), can receive the command data associated with the operation and can facilitate decoding the memory address to/from which data can be written or read (or erased). The decoder component 112 can then facilitate the selection of the proper word line(s) associated with the memory cell(s) to be accessed within memory array 104 during the operation, so that the operation can be performed to read/write/erase data from/to/from the memory cell(s). It is to be appreciated that the command data can also provide information as to the desired bit line(s) associated with the memory cell(s) to another component (e.g., Y-decoder) (not shown) to facilitate choosing the appropriate memory cell(s) on which to perform the operation.

To facilitate performance of operations on the memory device, each decoder subcomponent (e.g., 114) can include a global word line (also referred to herein as "GWL") 204 that can have a voltage level applied to it in order to select the global word line. Each decoder subcomponent (e.g., 114) can also include a gate (referred to as "VPXG gate") 206 that can facilitate passing the voltage (e.g., signal) from the global word line 204 to the boost-strap node 202. For example, when the VPXG gate 206 receives a predefined analog voltage, the VPXG gate 206 can open to allow the voltage associated with the global word line 204 to pass to the boost-strap node 202. The voltage level from the global word line 204 can be utilized during a pre-charge stage to charge the capacitor(s) of an associated regulator subcomponent (e.g., 122). To facilitate selecting the desired memory cell in a sector (e.g., 106), the decoder subcomponent can also include a vertical word line 208, where the voltage (e.g., signal) at the vertical word line can be passed through the gate associated with the boost-strap node 202, when the boost-strap node 202 reaches the desired level in order to open the gate, to allow the voltage associated with the vertical word line 208 to pass through to the corresponding memory cell word line associated with the memory cell in memory array 104 upon which the operation is being performed.

During an operation, in order to raise the voltage level at the boost-strap node 202 to the desired level to open the gate associated therewith, the booster component 128 can supply a voltage to the decoder subcomponents (e.g., 114, 116, 118) to ramp up the voltage level at the boost-strap node. To further facilitate increasing the voltage at the boost-strap node 202 to the desired level, each decoder subcomponent can include a regulator subcomponent (e.g., 122, 124, 126) that can include one or more capacitors.

During a pre-charge stage, the capacitor(s) can be charged based on the capacitance value of the capacitor(s), such as when the global word line 204 has a voltage level applied to it (e.g., GWL is selected), and the VPXG gate 206 is opened in order to allow the voltage at the global word line 204 to pass to the boost-strap node 202 thereby charging the capacitor(s) of the regulator subcomponent and associated with the boost-strap node 202. This can occur during a pre-charge stage, for example. The booster component 128 can then supply a booster voltage, which when added to the voltage provided by the capacitor(s) (of suitable capacitance value) of the regulator subcomponent (e.g., 122, 124, 126), can increase the voltage at the boost-strap node 202 to the desired level within a desired amount of time to open the gate associated therewith and allow the voltage at the vertical word line (e.g., when selected), so that the voltage at the vertical word line can pass to the memory cell word line to facilitate selecting the memory cell specified in the command data so that the memory cell can be accessed and the operation performed thereon. Thus, the word line of a memory cell associated with an operation can be selected if the global word line 204 is at a high voltage and passes through the VPXG gate 206 to the boost-strap node 202, and the voltage at the boost-strap node 202 is increased to the desired level to enable the vertical word line 208 signal to pass through the gate to the memory cell word line.

During read operations, it is desirable to increase the voltage level at the boost-strap node 202 at a fast rate in order to speed up the performance of read operations. As memory devices become more dense, the routing channel associated with the decoder subcomponents (e.g., 114, 116, 118) and associated sectors (e.g., 106, 108, 110), and booster component 128, can become longer as well as more narrow, which can result in parasitic elements, such as resistance in the channel and stray capacitance, becoming more prevalent and problematic, particularly the further distance away a sector (e.g., sector$_N$ 110) is from the booster component 128. The parasitic elements can be countered by increasing the "high voltage" applied to the global word line 204, VPXG gate 206, vertical word line 208, and the booster component 128. However, simply increasing the level of the "high voltage" can lead to undesirable results, as the sectors nearest to the booster component 128, such as sector$_0$ 106, can be subject to oxide breakdown due to the voltage level at the memory cell word line being too high, since the sectors (e.g., sector$_0$ 106) nearest to the booster component 128 are not subject to the same amount of parasitic elements as the sectors (e.g., sector$_N$ 110) further away from the booster component 128.

To counter the parasitic elements that can arise in the routing channel when accessing sectors farther away from the booster component 128, while still maintaining the high voltage level applied to components such that the risk of oxide breakdown in the sectors and other components is minimized or eliminated, the regulator component 120 can include regulator subcomponents, such as regulator subcomponent$_0$ 122 through regulator subcomponent$_N$ 126, that can have different levels of capacitance based on the amount of parasitic resistance and/or parasitic capacitance encountered in reaching a corresponding sector associated with the regulator subcomponent, and/or based on the distance via the routing channel that the sector associated with such regulator subcomponent is from the booster component 128.

A particular regulator subcomponent (e.g., 122, 124, 126) can be associated with the boost-strap node 202 of the associated decoder subcomponent (e.g., 114, 116, 118) and the capacitor(s) included in the regulator subcomponent can facilitate ramping up the voltage to the desired level within the desired amount of time during a read operation. During a pre-charge stage, the capacitor(s) can be charged to a certain level based on the capacitor value and/or the pre-charge voltage supplied. During the read operation, the booster component 128 can supply a voltage to the boost-strap node 202, and the capacitor(s) (of suitable capacitance value) of the particular regulator subcomponent can also provide the charge stored therein to the boost-strap node 202, and the combination can increase the voltage level at the boost-strap node 202 to the desired level within the desired amount of time.

The regulator subcomponent$_0$ 122 can have a base capacitor 210 having a suitable capacitance value such that, during a read operation, the boost-strap node 202 can reach the desired level within the desired amount of time, while not receiving so much charge that the sector$_0$ 106 may risk being subject to undue oxide breakdown. The regulator subcomponent$_N$ 126 can include the base capacitor 210 and can further include one or more extra-set capacitors 212, where the number of extra-set capacitors can be based on the total capacitance value desired in order to facilitate increasing the voltage level at the boost-strap node 202 to the desired level within the desired amount of time, and can be based on the distance via the routing channel the regulator subcomponent$_N$ 126 is from the booster component 128, and/or the amount of parasitic resistance and/or parasitic capacitance encountered at the associated decoder subcomponent$_N$ 118.

Figure 3:
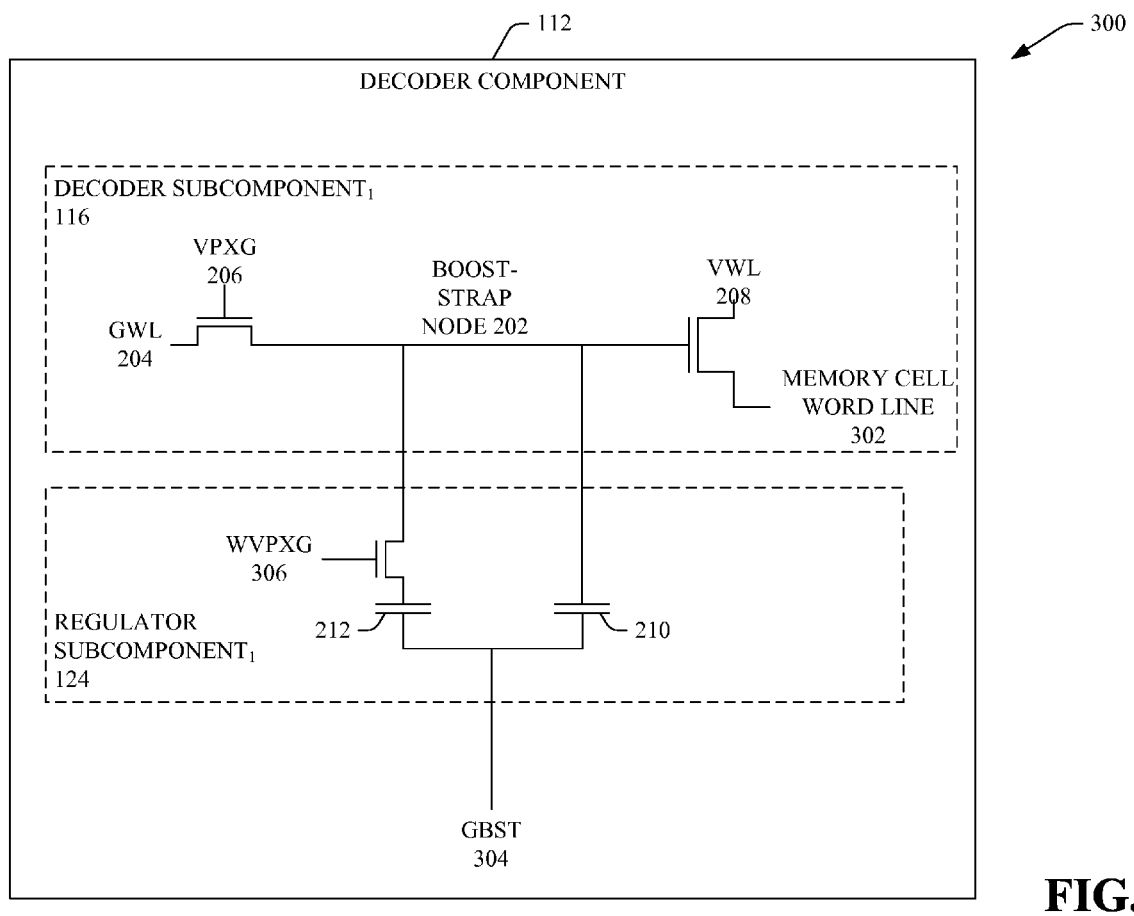
FIG. 3 illustrates a system that facilitates writing data to a memory in accordance with an embodiment of the disclosed subject matter.

Referring to FIG. 3, illustrated is a system 300 that facilitates writing data to a memory in accordance with the disclosed subject matter. System 300 can facilitate writing data to a desired memory cell (not shown) in memory (e.g., 102) (not shown), while ensuring that read operations can be performed at a desirable speed and also ensuring that write operations can be performed without causing the voltage level at the boost-strap node 202 to reach an undesirable level. During a write operation, there can be more time available to wait for the voltage level at the boost-strap node to reach the desired level. Thus, the additional charge that can be provided by additional capacitor(s) (e.g., extra-set capacitor(s) 212) is not necessary to increase the voltage level at the boost-strap node 202 to perform the write operation. Further, the charge from the extra-set capacitors 212 associated with a regulator subcomponent may not be desirable at the boost-strap node 202, as such charge may cause the voltage level at the boost-strap node 202 to be too high thereby potentially causing harm to electronic components (e.g., sectors).

System 300 can include a decoder component 112 that can have functionality as described herein, for example, with regard to system 100 and/or system 200. Decoder component 112 can include a plurality of decoder subcomponents (e.g., 114 through 118), although for clarity, only decoder subcomponent$_1$ 116 is depicted in FIG. 3. The decoder subcomponents (e.g., 116) can include all the functionality as described herein, for example, with regard to system 100 and/or system 200. Decoder component 112 can further include a plurality of regulator subcomponents (e.g., 122 through 126), although for clarity, only regulator subcomponent$_1$ 124 is depicted in FIG. 3. The regulator subcomponents (e.g., 124) can include all the functionality as described herein, for example, with regard to system 100 and/or system 200.

The decoding subcomponents (e.g., decoding subcomponent$_1$ 116) can each include a global word line 202 that, when selected, can have a high voltage. The decoding subcomponents can also include a VPXG gate 204 that can facilitate passing the voltage level (e.g., signal) at the global word line 204 to the boost-strap node 202. For example, when the voltage level at VPXG is high, the VPXG gate 204 can open thereby allow the voltage level at the global word line 204 to pass to the boost-strap node 202. The voltage of the global word line 204 can be utilized during a pre-charge stage to charge up the capacitors 210 (and/or extra-set capacitor(s) 212, if any are employed) of the regulator subcomponent (e.g., 124) associated with the boost-strap node 202. The global word line 204 can then be grounded during the booster stage that can ramp up the voltage at the boost-strap node 202 in order to facilitate performing the operation.

Each of the decoding subcomponents can further include a vertical word line 208 that can be at a high voltage level when selected. The selection of the global word line 204 (during pre-charge) and vertical word line 208 can be performed to facilitate selecting the desired memory cell word line to facilitate selecting the desired memory cell during an operation. During an operation, the voltage level at the boost-strap node 202 can be increased to a desired level in order to open the gate associated with the boost-strap node 202 to facilitate passing the voltage level at the vertical word line 208 to the memory cell word line 302 that can be sent to the corresponding sector (not shown) in the memory array (not shown) to facilitate selecting the desired memory cell.

When a sector and associated decoder subcomponent are relatively far away from the booster component (e.g., 128) (not shown), the regulator subcomponent may have a number of extra-set capacitors 212 in addition to a base capacitor 210, thereby having a significantly higher total capacitance value than other regulator subcomponents that are closer to the booster component, which can provide the booster voltage at GBST 304. The extra capacitance level can be desirable during a read operation. However, during a write operation, a regulator subcomponent having the base capacitor 210 and additional extra-set capacitors 212 may potentially achieve too high of a voltage level at the boost-strap node 202, which potentially can cause problems, such as damage to components. To minimize or eliminate the risk of such problems, during a write operation, each regulator subcomponent (e.g., 124) can include a gate 306 (referred to as "WVPXG gate 306") that can be included in each circuit branch having an extra-set capacitor and can facilitate cutting off or shielding any extra-set capacitors 212, and any charge stored therein, from the boost-strap node 202. After the write operation has been performed, the WVPXG 306 can be switched again to allow the extra-set capacitors 212 of the regulator subcomponent to be connected again to the boost-strap node 202.

For example, a regulator subcomponent$_1$ 124 can have one extra-set capacitor 212. During a write operation, the WVPXG 306 can be switched to cause the circuit to open in order to prevent any charge stored in the extra-set capacitor to be provided at the boost-strap node 202. The base capacitor 210 can still provide any charge stored therein to the boost-strap node 202, and further the booster component can provide the booster voltage via GBST 304 to ramp up the voltage level at the boost-strap node 202 to facilitate performing the write operation. The write operation can be performed, and the WVPXG 306 can be switched again to electrically connect the extra-set capacitor 212 to the boost-strap node 202.

Figure 4:
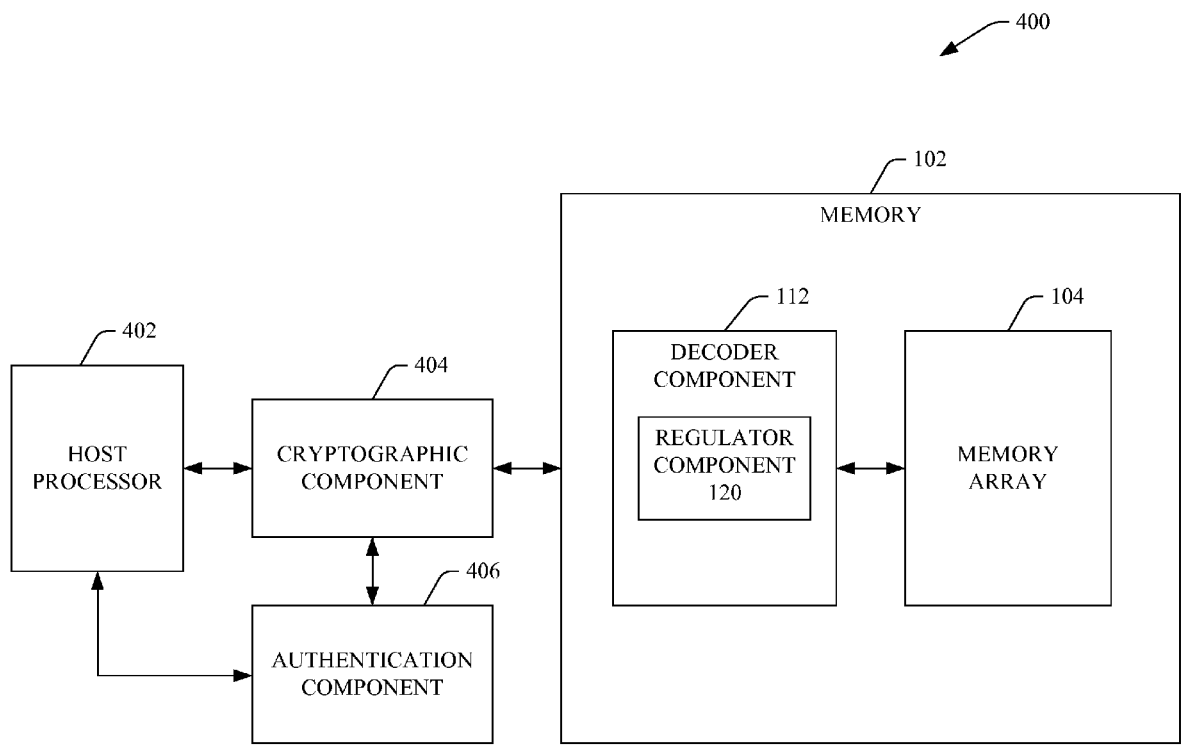
FIG. 4 illustrates a system that employs authentication and cryptography to secure access to data associated with a memory in accordance with an aspect of the subject matter disclosed herein.

Turning now to FIG. 4, depicted is a system 400 that can employ authentication and cryptography to secure data associated with a memory in accordance with the disclosed subject matter. System 400 can include a memory 102 that can store data in memory cells (not shown) that can be associated with memory addresses that can be utilized to identify the respective locations of the memory cells. The memory 102 can include a memory array 104, and a decoder component 112 that can include a regulator component 120. Memory 102, memory array 104, decoder component 112, and regulator component 120 can each include all the functionality as described herein with respect to such components, for example, with regard to system 100, system 200, and/or system 300.

System 400 can further include a host processor 402 that can be a typical applications processor that can manage communications and run applications. The host processor 402 can generate commands, including read, write, and/or erase commands, in order to facilitate reading data from, writing data to, and/or erasing data from memory 102. The host processor 402 can be associated with a cryptographic component 404 that can facilitate encrypting data being written to memory 102 and decrypting data being read from memory 102 in order to secure data associated with memory 102.

The cryptographic component 404 can facilitate the utilization of one or more encryption/decryption facilities to ensure that communications between the host processor 402 and the memory 102 are not compromised by one of the many malicious extant viruses. The cryptographic component 404 can utilize one or more encryption/decryption mechanisms to obscure data communicated between the host processor 402 and memory 102. Examples of encryption/decryption mechanisms that can be employed to obscure the data can include utilization of hashing algorithms, public key encryption, elliptic curve encryption, and the like.

The cryptographic component 404 can provide symmetric cryptographic tools and accelerators (e.g., Twofish, Blowfish, AES, TDES, IDEA, CAST5, RC4, etc.) to ensure that a specified partition (not shown) in memory 102, or portions thereof, can only be accessed by those entities authorized and/or authenticated to do so. Cryptographic component 404 can also provide asymmetric cryptographic accelerators and tools (e.g., Diffie-Hellman, Digital Signature Standard (DSS), Elliptical Curve techniques, RSA, IKE, PGP, and the like) to ensure that a specified partition in memory 102, or portions thereof, are only accessed by those entities that are authorized and certified to do so. Additionally, cryptographic component 404 can provide accelerators and tools (e.g., Secure Hash Algorithm (SHA) and its variants such as, for example, SHA-0, SHA-1, SHA-224, SHA-256, SHA-384, and SHA-512) to ensure that access to the specified partition in memory 102 is confined to those entities authorized to gain access.

The host processor 402 and cryptographic component 404 can each be associated with an authentication component 406 that can solicit authentication data from an entity, and, upon the authentication data so solicited, can be employed, individually and/or in conjunction with information acquired and ascertained as a result of biometric modalities (discussed infra) employed, to control access to memory 102. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like. Additionally and alternatively, public key infrastructure (PKI) data can also be employed by authentication component 406. PKI arrangements can provide for trusted third parties to vet, and affirm, entity identity through the use of public keys that typically are certificates issued by the trusted third parties. Such arrangements can enable entities to be authenticated to each other, and to use information in certificates (e.g., public keys) to encrypt and decrypt messages communicated between entities.

Authentication component 406 can also implement one or more machine-implemented methods to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

It is to be appreciated that, while system 400 depicts cryptographic component 404 and authentication 406 as components separate from the memory 102, the disclosed subject matter is not so limited. The memory 102, the cryptographic component 404, and/or the authentication component 406 can be situated on a single integrated circuit (IC) chip, and/or can be situated on separate IC chips, in accordance with the disclosed subject matter.

Systems 100, 200, 300, and/or 400 can be included in most any electronic device that can include a memory (e.g., 102). By way of example, and not by limitation, examples of such an electronic device can include a computer, a personal digital assistant (PDA), a cellular phone, a digital phone, an answering machine, a video device, a television, a digital versatile diskplayer/recorder, a music player/recorder, an MP3 player, a digital recorder, a digital camera, a microwave oven, an electronic organizer, an electronic toy, an electronic game, a scanner, a reader, a printer, a copy machine, or a facsimile machine.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 5:
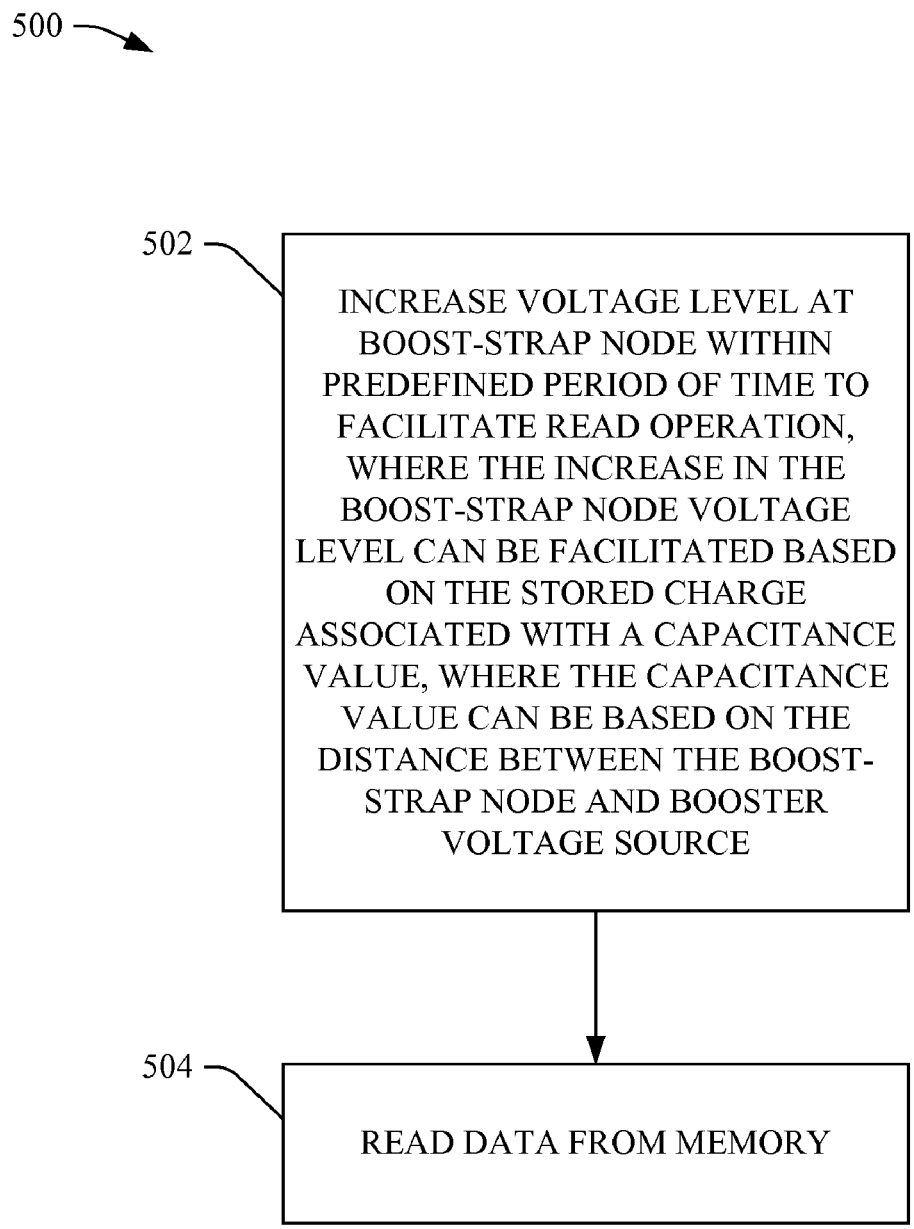
FIG. 5 illustrates a methodology that facilitates reading data from a memory in accordance with an aspect of the disclosed subject matter.
Figure 6:
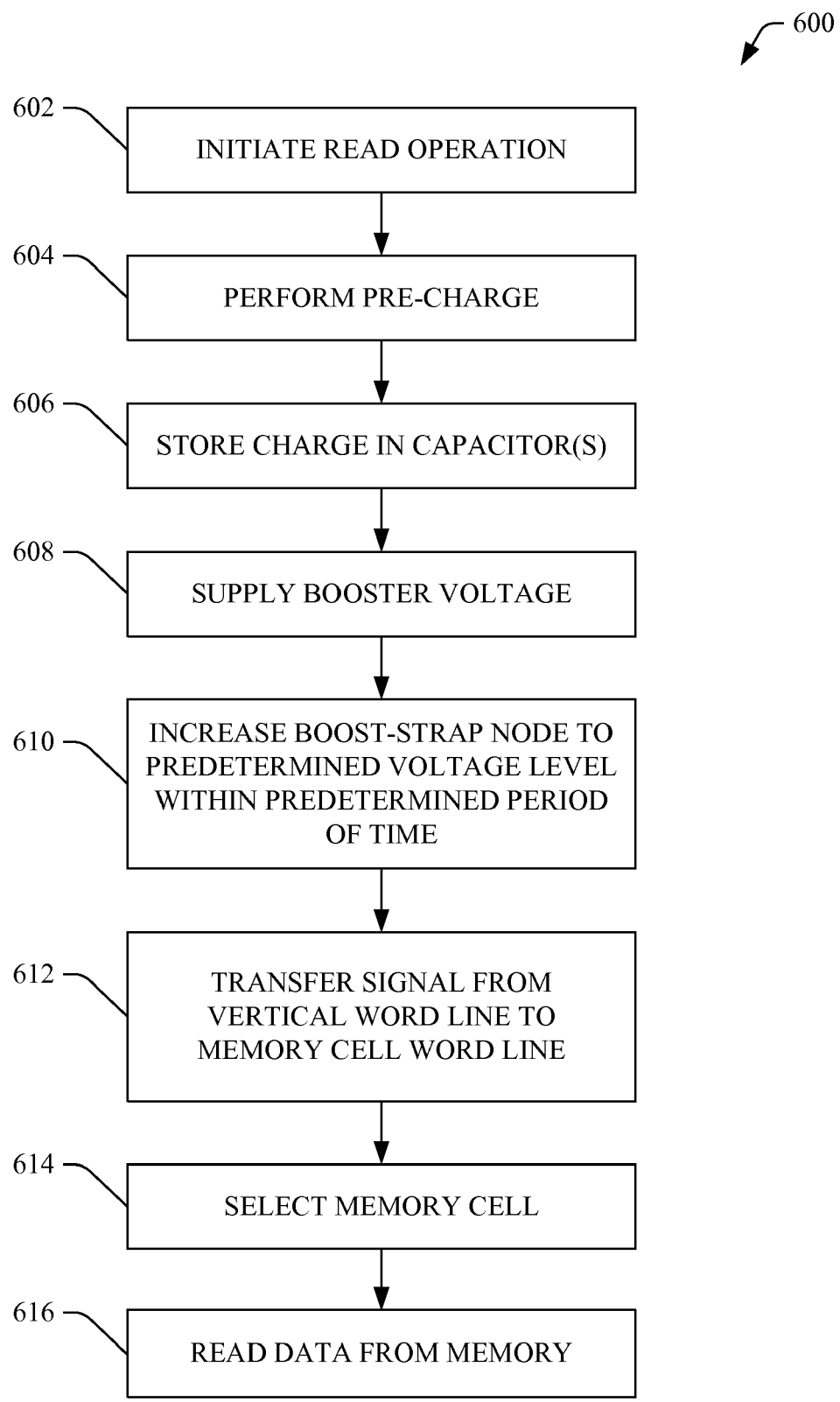
FIG. 6 illustrates another methodology that facilitates reading data from a memory in accordance with an aspect of the subject matter disclosed herein.
Figure 7:
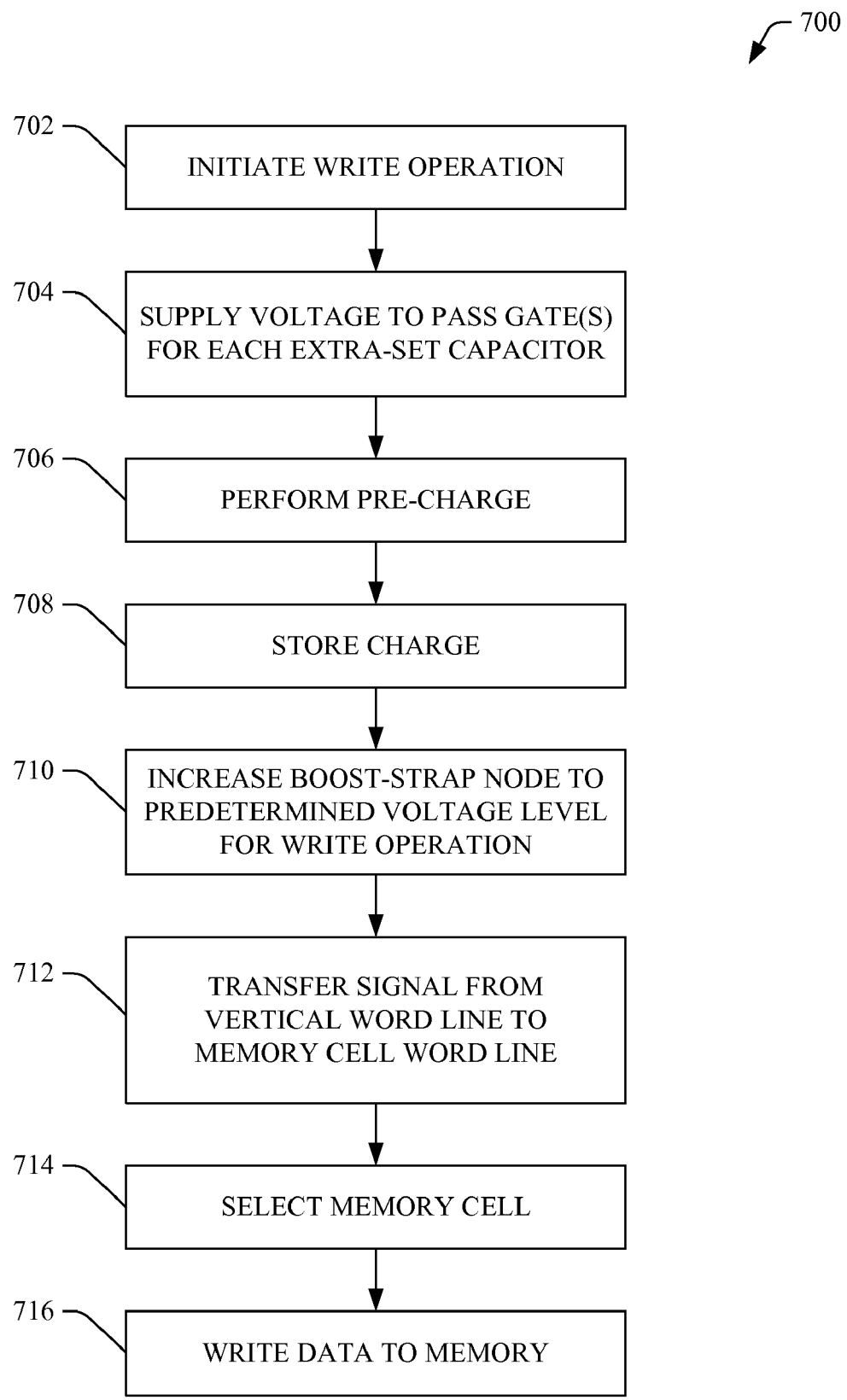
FIG. 7 illustrates a methodology that facilitates writing data to a memory in accordance with an aspect of the disclosed subject matter.

FIGS. 5-7 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 5, a methodology 500 facilitating reading data from a memory in accordance with the disclosed subject matter is illustrated. At 502, during a read operation, the voltage level at the boost-strap node (e.g., 202) can be increased to a desired level within a predefined period of time to facilitate selection of a memory cell word line associated with the boost-strap node in order to facilitate selection of a memory cell, associated with the memory cell word line, in memory (e.g., 102) that is desired to be accessed based on the read operation, where the increase to the desired boost-strap node voltage level can be facilitated based on the amount of stored charge in a capacitor(s) associated with the boost-strap node. The amount of stored charge can be based on the capacitance value of the one or more capacitors (e.g., 210, 212) of the regulator subcomponent. Further, the capacitance value of the one or more capacitors can be based on the distance the boost-strap node 202 is from the booster voltage source (e.g., booster component 128).

For example, the further the distance away from the booster component a boost-strap node associated with a decoder subcomponent (e.g., 118) is, via a routing channel, the lower the booster voltage level can be at the boost-strap node during a read operation due to parasitic elements (e.g., channel resistance, stray capacitance) that can arise due to the distance between the decoder subcomponent and booster component. A regulator subcomponent can have a predetermined capacitance value, which can comprise a base capacitor (e.g., 210) and/or an extra-set capacitor(s) (e.g., 212), where the capacitance value can be based on the distance a boost-strap node and/or a decoder subcomponent associated therewith is from the booster component and/or correspondingly based on the amount of parasitic resistance and/or parasitic capacitance that can result from the distance between the booster component and the decoder subcomponent, and associated boost-strap node, via the routing channel.

At 504, the data can be read from the selected memory cell in memory. For example, the memory cell word line can be selected as a result of the boost-strap node voltage level being increased to a desired level. The memory cell word line can be associated with a memory cell in memory which can contain the data associated with the read operation. Further, for example, a bit line can be selected (e.g. using a Y-decoder) to facilitate accessing the memory cell which can contain the data associated with the read operation. As a result, the memory cell associated with the read operation can be accessed, and the data can be read from memory. At this point, methodology 500 can end.

Turning to FIG. 6, illustrated is another methodology 600 facilitating reading data from a memory in accordance with the disclosed subject matter. At 602, a read operation can be initiated. For example, a host processor (e.g., 402) can initiate a read operation to read data from a memory device (e.g., 102). The command data associated with the read operation can specify the memory address(es) in the memory device from which the data can be read. At 604, a pre-charge can be performed to charge components (e.g., capacitors) to facilitate performing the read operation. To perform the pre-charge, a voltage supplied via the global word line (e.g., 204) can be passed to the boost-strap node by passing through VPXG gate 206, where the voltage level at gate 206 can be high to open the gate thereby allowing the voltage level at the global word line to pass to the boost-strap node. At 606, charge from the pre-charge voltage source (e.g., global word line) can be stored in the capacitors associated with a regulator subcomponent (e.g., 122, 124, 126) and electrically connected to the boost-strap node. The amount of charge stored in the capacitors can be based on the total capacitance value of the capacitors and/or the voltage level associated with the pre-charge voltage source. The total capacitance value can be based on the distance the boost-strap node and/or associated decoder subcomponent is from the booster component and/or correspondingly based on the amount of parasitic resistance and/or parasitic capacitance that can result from the distance between the booster component and the decoder subcomponent, and associated boost-strap node, via the routing channel. The further away a decoder subcomponent is from the booster component, the higher the parasitic resistance/capacitance, and as a result, the higher the capacitance in the regulator subcomponent in order to counter the parasitic resistance/capacitance.

At 608, the booster voltage can be supplied, for example, by the booster component to facilitate increasing the voltage level at the boost-strap nodes of decoder subcomponents in order to facilitate passing the voltage at the vertical word line to the memory cell word line in the sector(s) associated with the read operation. Where the decoder subcomponent is associated with a memory cell that is to be read as part of the read operation, the booster voltage supplied to the boost-strap node and the charge supplied by the capacitors of the associated regulator subcomponent can increase the voltage level at the boost-strap node to the desired level in order to open the gate associated therewith. The opening of the gate can enable the voltage level at the vertical word line to pass to the memory cell word line, where the voltage level at the vertical word line can be at a high level since the decoder subcomponent is associated with the memory cell that is part of the read operation. The high voltage level passed to the memory cell word line can be sent to the memory array (e.g., 104) to facilitate selecting the desired memory cell in the memory to read the data therefrom.

As an example where a particular decoder subcomponent is associated with a memory cell that is not the subject of the read operation, during the read operation, the boost-strap node will not reach the predefined voltage level in order to trigger or open the gate associated with the boost-strap node. That is, if the global word line voltage was low during the pre-charge stage, that can be because the sector associated with the particular decoder component does not have a memory cell that is the subject of the read operation. Since the global word line was at a low level, the capacitors of the associated regulator subcomponent will have little or no charge stored therein during the pre-charge stage. When the booster stage occurs, there will not be sufficient charge at the boost-strap node to open the gate associated therewith. As a result, the voltage at the vertical word line is not passed to the memory cell word line, which can thereby remain at a low level (e.g., not selected), so the memory cell associated therewith will not be accessed during the read operation. Further, even if the voltage level of the global word line was at a high level and the gate at the boost-strap node is opened, if the voltage level of the vertical word line is at a low level and that is passed to the memory cell word line, the memory cell associated therewith will not be selected or accessed.

At 610, the voltage level at the boost-strap node(s) of decoder subcomponent(s) can be increased to a predefined voltage level within a predefined period of time in order to facilitate passing the voltage at the vertical word line to the memory cell word line in the sector(s) associated with the read operation. At 612, the voltage level at the vertical word line can be passed through the boost-strap node gate to the memory cell word line.

At 614, the memory cell can be selected from which the data can be read. For example, when the voltage at the vertical word line is passed to the memory cell word line, which can be electrically connected to the memory array in the memory. The voltage level at the vertical word line can be at a high level, since it is associated with the memory cell that is associated with the read operation. The memory array can recognize that the memory cell word line is at a high level, and along with bit line information, a memory cell(s) associated with the read operation can be selected. At 616, the data can be read from memory, as the selected memory cell can be accessed, and, the data read from the memory can be presented, for example, to the host processor. At this point, methodology 600 can end.

FIG. 7 depicts a methodology 700 facilitating writing data to a memory in accordance with the disclosed subject matter. At 702, a write operation can be initiated. For example, a host processor (e.g., 402) can initiate a write operation to write data to a memory cell, associated with a memory address, in a memory device (e.g., 102). The command data associated with the write operation can specify the memory address(es) in the memory device to which the data can be written. At 704, a desired voltage can be supplied to a pass gate(s) that can be included in each branch of a circuit within a regulator subcomponent that includes an extra-set capacitor. The pass gate(s) can be closed in order to open the circuit(s), so that the extra set(s) of capacitors are unable to supply any charge stored therein to the boost-strap node (e.g., 202). It is to be appreciated that the base capacitor can still be electrically connected to the boost-strap node during this time.

At 706, a pre-charge can be performed to charge components (e.g., capacitors) to facilitate performing the write operation. To perform the pre-charge, a voltage supplied via the global word line (e.g., 204) can be passed to the boost-strap node by passing through VPXG gate 206, where the voltage level at gate 206 can be high to open the gate thereby allowing the voltage level at the global word line to pass to the boost-strap node. At 708, charge from the pre-charge voltage source (e.g., global word line) can be stored in the base capacitor associated with a regulator subcomponent and electrically connected to the boost-strap node. The amount of charge stored in the base capacitor can be based on the total capacitance value of the capacitors and/or the voltage level associated with the pre-charge voltage source. Since any extra-set capacitors have been cut-off or shielded from the boost-strap node, the extra-set of capacitors will not be charged during the pre-charge.

At 710, the voltage level at the boost-strap node can be increased to the predefined voltage level to facilitate writing the data to memory. The boost-strap node can receive the charge stored in the base capacitor as well as the charge from the booster voltage source (e.g., booster component 128) that can be electrically connected to the decoder subcomponent and associated boost-strap node via the routing channel. The combined voltage levels of the booster voltage and the voltage from the base capacitor can increase the voltage level at the boost-strap node to a predefined level in order to facilitate performing the write operation.

At 712, the voltage level at the vertical word line can be passed to the memory cell word line. Once the voltage level at the boost-strap node reaches the predefined level, the gate associated therewith can open thereby allowing the voltage level at the vertical word line to pass to the memory cell word line. The voltage level at the vertical word line can be at a high level, since the vertical word line is associated with a memory cell to which data is being written. At 714, the memory cell(s) associated with the write operation can be selected. The high voltage level has passed from the vertical word line to the memory cell word line, and the memory cell word line is connected to the memory array (e.g., 104) in the memory. The memory cell(s) can be selected since the memory cell word line is high (and decoding associated with a Y-decoder has resulted in the bit line(s) associated with the memory cell(s) being at a high level). At 716, the data can be written to the memory cell(s) selected based on the write command. At this point, methodology 700 can end.

As utilized herein, terms "component," "system," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates access of data from a memory, comprising:
    a decoder component that comprises of a plurality of decoding subcomponents, where each decoding subcomponent of the plurality of decoding subcomponents facilitates access of data from or to the memory and includes a boost-strap node; and
    a regulator component associated with the decoder component that employs a plurality of subsets of capacitors, a subset of capacitors is respectively associated with each boost-strap node, the respective value of each subset of capacitors is determined based in part on a distance between a decoder subcomponent associated with a respective boost-strap node and a booster component to facilitate access to read data from the memory.

2. The system of claim 1, the regulator component comprises a plurality of regulator subcomponents that are each respectively associated with a corresponding decoding subcomponent, each regulator subcomponent comprises a respective subset of capacitors to facilitate increasing the voltage level at the boost-strap node of the corresponding decoding subcomponent to a predefined voltage level within a predefined period of time during a read operation, a capacitance value of the respective subset of capacitors of each regulator subcomponent is determined based in part on a distance via a routing channel between the corresponding decoding subcomponent and the booster component connected to the routing channel.

3. The system of claim 2, the respective subset of capacitors is comprised of a base capacitor, or a base capacitor and at least one extra-set capacitor.

4. The system of claim 3, each of the regulator subcomponents includes at least one gate that can be utilized to open the circuit associated with a boost-strap node and each circuit branch that includes an extra-set capacitor to disconnect each extra-set capacitor from the boost-strap node during a write operation.

5. The system of claim 1, the memory is comprised of a plurality of sectors that and each sector includes at least one memory cell, each sector is associated with a corresponding decoder subcomponent.

6. The system of claim 1, further comprising a gate associated with a boost-strap node, when the voltage at the boost-strap node reaches the predefined voltage level, the gate opens to pass the voltage level at a vertical word line to a memory cell word line associated with at least one memory cell in the memory.

7. The system of claim 1, each decoder subcomponent further comprises a global word line that, when selected during an operation, is passed through a gate when the gate is open to supply a voltage at the boost-strap node and charges the subset of capacitors associated with the boost-strap node prior to a booster stage.

8. The system of claim 1, the memory is a non-volatile memory comprising at least one of a flash memory, a read only memory (ROM), a programmable ROM (PROM), an erasable programmable read only memory (EPROM), an electronically erasable programmable read only memory (EEPROM), or a combination thereof.

9. An electronic device comprising the system of claim 1, the electronic device comprising one of a computer, a personal digital assistant, a cellular phone, a digital phone, an answering machine, a video device, a television, a digital versatile diskplayer/recorder, a music player/recorder, an MP3 player, a digital recorder, a digital camera, a microwave oven, an electronic organizer, an electronic toy, an electronic game, a scanner, a reader, a printer, a copy machine, or a facsimile machine.

10. A memory device, comprising:
    a decoder component associated with the memory device, the decoder component includes a regulator component and a plurality of decoding subcomponents, wherein each decoding subcomponent of the plurality of decoding subcomponents contains a boost-strap node and facilitates access of data from or to at least one memory cell associated therewith in the memory device; and
    the regulator component comprises a plurality of subsets of capacitors, each subset of capacitors is respectively associated with each boost-strap node, the respective value of each subset of capacitors is determined based in part on a distance between a decoding subcomponent associated with a respective boost-strap node and a booster component to facilitate access to read data from the memory.

11. The memory device of claim 10, the regulator component comprises a plurality of regulator subcomponents that are correspondingly associated with the plurality of decoding subcomponent, wherein each regulator subcomponent contains a subset of capacitors to facilitate raising the voltage level at the boost-strap node of the corresponding decoder subcomponent to a predetermined voltage level within a predetermined period of time during an operation, and each subset of capacitors of a regulator subcomponent has a distinct capacitance value that is determined based in part on a distance via a routing channel between the decoding subcomponent, which corresponds to the regulator component, and the booster component connected to the routing channel, wherein the operation is one or a write operation, a read operation, or an erase operation.

12. The memory device of claim 10, the booster component supplies a voltage level to the boost-strap node during the operation to facilitate an increase in the voltage level at the boost-strap node to the predetermined voltage level within the predetermined period of time to open a gate associated with the boost-strap node to enable a voltage level of a vertical word line pass through the gate to a memory cell word line.

13. The memory device of claim 10, a subset of capacitors of a particular regulator subcomponent comprises a base capacitor, or a base capacitor and at least one extra-set capacitor.

14. The memory device of claim 10, the memory device is a non-volatile memory device comprising at least one of a flash memory, a read only memory (ROM), a programmable ROM (PROM), an erasable programmable read only memory (EPROM), an electronically erasable programmable read only memory (EEPROM), or a combination thereof.

15. A method for accessing data in a memory, comprising:
    providing a plurality of subsets of capacitors, wherein each subset of capacitors is respectively associated with each boost-strap node;
    supplying a booster voltage level at each boost-strap node; and
    supplying a voltage level from each subset of capacitors associated with the boost-strap node that is sufficient, when combined with the booster voltage level, to raise the voltage level at each boost-strap node to a predetermined voltage level within a predetermined period of time during an operation to facilitate performing the operation on the memory, the capacitance value of the respective subset of capacitors is determined based in part on a distance between the respective boost-strap node and a booster component that is associated with the boost-strap node and supplies the booster voltage level.

16. The method of claim 15, further comprising:
selecting a global word line;
raising a voltage level at the global word line to a high level;
opening a gate associated with the global word line to pass the voltage level at the global word line to the boost-strap node;
pre-charging the subset of capacitors based on the voltage level from the global word line;
storing the charge from the pre-charge in the subset of capacitors; and
grounding the global word line after the subset of capacitors is charged.

17. The method of claim 16, further comprising:
supplying a booster voltage to the boost-strap node during an operation, the operation is one of a read operation, a write operation, or an erase operation;
providing the voltage level stored in the subset of capacitors to the boost-strap node during the operation;
opening a gate associated with the boost-strap node when the voltage level at the boost-strap node reaches a predetermined voltage level; and
transferring the voltage level at a vertical word line through the open gate to a memory cell word line associated with at least one memory cell in the memory.

18. The method of claim 17, further comprising:
supplying a voltage to switch a gate in each branch of a circuit that contains an extra-set capacitor; and
disconnecting each extra-set capacitor from the circuit associated with the boost-strap node during a write operation, a base capacitor is connected to the boost-strap node.

19. The method of claim 17, further comprising:
selecting the at least one memory cell when the voltage level at the memory cell word line is at a high level;
performing the operation on the at least one memory cell that is selected; and
one of reading data from the at least one memory cell that is selected, writing data to the at least one memory cell that is selected, or erasing data from the at least one memory cell that is selected.

20. The method of claim 15, further comprising:
grouping sectors associated with the memory into a predetermined number of groups based on the distance a boost-strap node respectively associated with a sector is from the booster component;
determining a capacitance level of a base capacitor such that the base capacitor provides enough charge during a read operation to facilitate raising the voltage level at the boost-strap node to a predetermined voltage level within a predetermined period of time for each boost-strap node associated with a first group of sectors that is nearest to the booster component; and
determining a capacitance level of an extra-set capacitor such that the base capacitor plus at least one extra-set capacitor provides enough charge during a read operation to facilitate raising the voltage level at the boost-strap node to a predetermined voltage level within a predetermined period of time for each boost-strap node associated with at least one other group of sectors that positioned at a distance further away from the booster component than each of the boost-strap nodes associated with the first group.

* * * * *